United States Patent
Dervin

(10) Patent No.: US 8,095,843 B2
(45) Date of Patent: Jan. 10, 2012

(54) METHOD OF ACQUIRING A PLURALITY OF LOGIC SIGNALS, WITH CONFIRMATION OF STATE VALIDITY

(75) Inventor: Patrick Dervin, Paris (FR)

(73) Assignee: Thales (FR)

( * ) Notice: Subject to any disclaimer, the term of this patent is extended or adjusted under 35 U.S.C. 154(b) by 36 days.

(21) Appl. No.: 12/815,378

(22) Filed: Jun. 14, 2010

(65) Prior Publication Data
US 2010/0315117 A1    Dec. 16, 2010

(30) Foreign Application Priority Data
Jun. 12, 2009 (FR) .................. 09 02872

(51) Int. Cl.
| G06F 11/00 | (2006.01) |
| G06F 11/30 | (2006.01) |
| G08C 25/00 | (2006.01) |
| H03M 13/00 | (2006.01) |
| H04L 1/00 | (2006.01) |
| H03K 19/003 | (2006.01) |

(52) U.S. Cl. ............................... 714/746; 326/11
(58) Field of Classification Search ............ 326/11, 326/746, 763, 718
See application file for complete search history.

(56) References Cited

U.S. PATENT DOCUMENTS 6,363,502 B1 * 3/2002 Jeddeloh .................. 714/52
2008/0082870 A1 * 4/2008 Park ........................ 714/704
2009/0027981 A1    1/2009 Dervin
2011/0107166 A1 * 5/2011 Flautner et al. ........... 714/746

FOREIGN PATENT DOCUMENTS

| DE | 199 19 974 A1 | 11/2000 |
| JP | 57-101955 A | 6/1982 |
| JP | 59-173848 A | 10/1984 |

* cited by examiner

*Primary Examiner* — Shawki S Ismail
*Assistant Examiner* — Dylan White
(74) *Attorney, Agent, or Firm* — Baker & Hostetler, LLP

(57) ABSTRACT

A method of ACM acquisition/confirmation of a plurality of logic signals SI(i) combines a loop for the single confirmation processing for all the sampled signals, with a sequential sampling of these signals. On each sampling, the confirmation loop processes the current sampled signal SI(i), in order to decide on the updating of an output register Qs(i) with the current sampled state $S_k$, depending on whether or not it is confirmed, either that this state is not to be confirmed, or that this state is to be confirmed, and that the associated confirmation duration τ has elapsed. The confirmation loop uses a dating mechanism capable of supplying a current date used to supply the dates on which the logic state transitions are observed, and to allow measurements of the elapsed durations since these transition dates, and, for each processed signal, a parameter memory M-P(i), making it possible to program the confirmation of the associated signal as a function of criteria common to all the signals, and a status memory M-ST(i) which stores at least two items of information ST1 and ST2 corresponding respectively to the last state seen $S_p$ for this signal and to the date of transition Dt into this state (ST2).

17 Claims, 8 Drawing Sheets

METHOD OF ACQUIRING A PLURALITY OF LOGIC SIGNALS, WITH CONFIRMATION OF STATE VALIDITY

CROSS-REFERENCE TO RELATED APPLICATIONS

This application claims priority to foreign Patent Application FR 0902872, filed on Jun. 12, 2009, the disclosure of which is incorporated herein by reference in its entirety.

FIELD OF THE INVENTION

The field of the invention is that of the acquisition of logic signals, of which one or both states must be confirmed before being used by the hardware and/or software application system.

BACKGROUND OF THE INVENTION

The confirmation of the logic state of a signal means the assurance that this signal has been in this logic state for at least a certain time. The aim is to eliminate all bounce phenomena and other interference phenomena, by filtering pulses that are too short with respect to the average frequency of the observed logic transitions for the signal in question. In this manner, the application will not see these too short pulses and will therefore not be disrupted or induced into error by incorrect information.

Such a confirmation mechanism is notably useful in application systems comprising sensitive functions such as security functions, the processing processes of which are based on the state of logic signals which may be, for example, signals supplied by control members or signals supplied by sensors, reporting the state of certain hardware or of software processes.

In case of input signals coded on 1 bit, the confirmation mechanism usually associates an output flip-flop with each logic input, and this flip-flop is updated with the current state of the associated logic input only on condition that this input has been in this state for a minimum duration, corresponding to a duration of confirmation of this state. The output of the flip-flop therefore gives as information a confirmed state of the input, information that is used by the application.

This mechanism is illustrated in FIG. 1, which shows a logic signal S, and the output Q of the associated flip-flop, as a function of time. Initially, the signal S and the output Q of the flip-flop are both at "0". At the time t1, the signal S switches to "1". S remains in this state "1" until t2, when it switches back to "0". The width of the corresponding pulse lp equals t2−t1. It is below a threshold τ, equal to the confirmation duration of the logic state "1". The output flip-flop is not updated: the output Q remains at "0".

At time t3, the signal S switches back to the "1" state. In the example, it remains in this state for a duration longer than the threshold τ. From the time t4, equal to t3+τ, the output flip-flop can be updated with the current state of the signal S: the output Q switches to "1".

Therefore, with such a confirmation mechanism, the information used by the application system is not the current, instantaneous state of the logic signal S, but a confirmed state Q of this signal.

In practice, according to the prior art, the mechanism for confirming a logic signal is applied by means of a counter. Every time the value of the signal changes, the counter is reset and begins counting. Every time the counter reaches a value which corresponds to the confirmation duration, the output flip-flop is updated with the current state of the input signal. If a reverse transition occurs before the counter has reached this value, it is reset and the output flip-flop will not be updated.

An illustration of this confirmation mechanism by counting is shown in FIG. 2 for the following conditions: the two logic states "0" and "1" of the signal S are each to be confirmed and the confirmation duration is the same for both states, equal to τ. According to this mechanism, every time the state of the signal S changes, the counter is reset and counts at the speed of a clock. Every time the counter reaches a value N, which corresponds to the confirmation duration τ, the output flip-flop is updated with the current state of the signal S. At the beginning, the signal S and the output Q of the flip-flop are at "0".

At the point A, the signal S switches from "0" to "1"; a counter CT starts counting again from zero.

At the point B, before the counter CT has reached the count N, the signal S switches from "1" to "0": the counter CT begins counting again from zero.

At the point C, the counter reaches the threshold N: the output flip-flop is updated with the current state "0" of the signal S. In practice, the output Q remains unchanged at "0". In the exemplary application illustrated, when the counter reaches the threshold N, it stops counting.

At the point D, the signal S switches from "0" to "1": the counter starts counting again from zero.

At the point E, the counter reaches the threshold N: the output flip-flop is updated with the current state "1" of the signal S. In the example, the output Q switches from "0" to "1".

This simple example shows how the short pulses, that is, shorter than the confirmation duration, are filtered by the confirmation mechanism, and also shows the delay of the item of information Q used by the application system, relative to the "true" transitions of the logic signal. This delay is substantially equal to the confirmation duration.

But in practice, depending on the application system concerned and the nature of the logic signals to be processed, the filtering requirements may vary. In particular, the confirmation durations of the two logic states of one and the same signal may vary. To illustrate this aspect, a logic signal indicating the out or in state of the landing gear of an aircraft, or a logic signal indicating the enabled or standby state of a security software process of an aircraft piloting assistance system, are examples of 1 bit logic signals for which it is useful to confirm both possible logic states, "0" and "1", before account is taken by an application system.

More generally, each logic signal has its own specific features in terms of need for confirmation of the possible logic states, and of confirmation duration attached to each state, which is typically associated with the average frequency of appearance of this state for the signal in question, which depends on the function or on the circuit that it represents.

If consideration is given to m-bit logic signals, m≧1, it would be necessary to provide with the counting mechanism of FIG. 2 at least as many counters, with the associated logic circuitry, as signals in order to validate at least one state per signal. If several logic states are to be confirmed for each signal, for example 4, with different confirmation durations, the confirmation logic is to be multiplied by four. This solution therefore quickly becomes unsuitable when it is necessary to process a large number of logic signals and/or of logic states of these signals.

Such a confirmation mechanism, although it is simple to design, very quickly becomes cumbersome when the number of logic signals to be confirmed becomes too great.

In addition, the advances in safety of many electronic systems causes inflation in the number of logic signals to be processed, which may be greater than a hundred, whether they be signals originating from electronic sensors which are ever more numerous; or control and/or alarm signals not to mention the redundancy schemes provided in the systems which have a multiplying effect.

Other problems such as the electrical specifications of the interfaces of the system equipment add to the complexity of applying a confirmation mechanism suitable for complex electronic systems and their upgrades.

SUMMARY OF THE INVENTION

Embodiments of the present invention advantageously solve the problem of confirming the logic states of a plurality of logic signals.

One aspect of the present invention provides a mechanism for the acquisition/confirmation of a plurality of logic signals applied as inputs, which combines a single confirmation-processing loop for all the sampled signals with a sequential sampling of these signals. At each sampling, the confirmation loop processes the current sampled signal in order to decide on whether to update an output register with the current sample state, depending on whether it is confirmed or not, that is, whether this state is not to be confirmed, or whether this state is to be confirmed, and whether the associated confirmation duration has elapsed. The confirmation loop uses a dating mechanism capable of supplying a current date used to supply the dates on which logic state transitions are observed, and to allow measurements of the durations that have elapsed since these transition dates, and, for each processed signal, a parameter memory making it possible to program the confirmation of the associated signal as a function of criteria common to all the signals, and a status memory which stores at least two items of information corresponding respectively to the last state seen for this signal and to the date of transition into this state.

It is possible to process without distinction all the possible logic states of an m-bit logic signal, m≧1, the decision process for the updating of the output register being capable of distinguishing the logic states that are not to be confirmed, that are equivalent to states to be confirmed with a zero confirmation duration, in order to command the immediate updating of the output register with the sampled logic state, and those that are effectively to be confirmed, with a confirmation duration that is necessarily non-zero, so as not to update the output register unless this duration has elapsed since the transition detection of the signal into this state.

BRIEF DESCRIPTION OF THE DRAWINGS

Other features and advantages are detailed in the attached description of an exemplary embodiment of the invention, with reference to the appended drawings in which.

DETAILED DESCRIPTION

Figure 1:
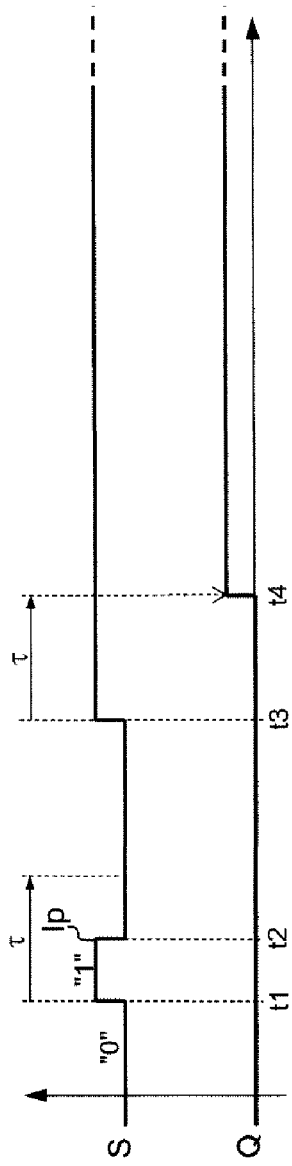
FIG. 1, already described, is a diagram illustrating the mechanism for confirming a logic state of a signal.
Figure 2:
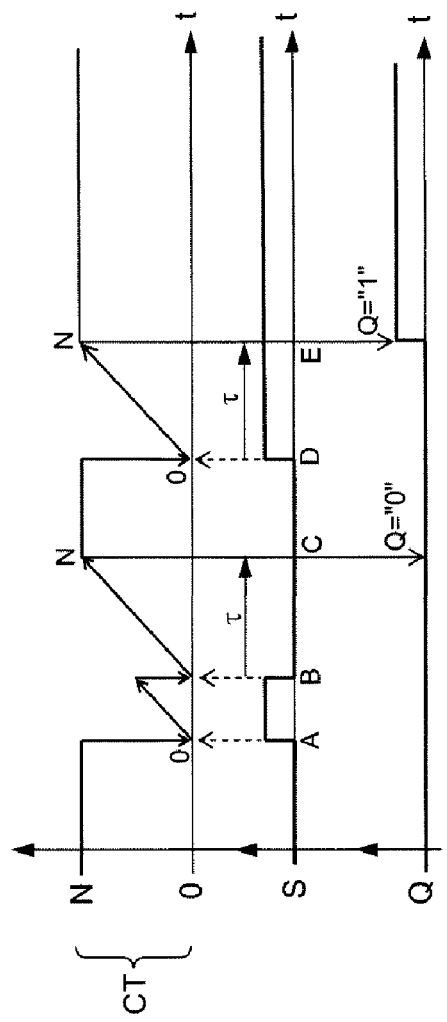
FIG. 2, already described, is a diagram illustrating a mechanism for confirming each of the two states of a logic signal, by counting.
Figure 3:
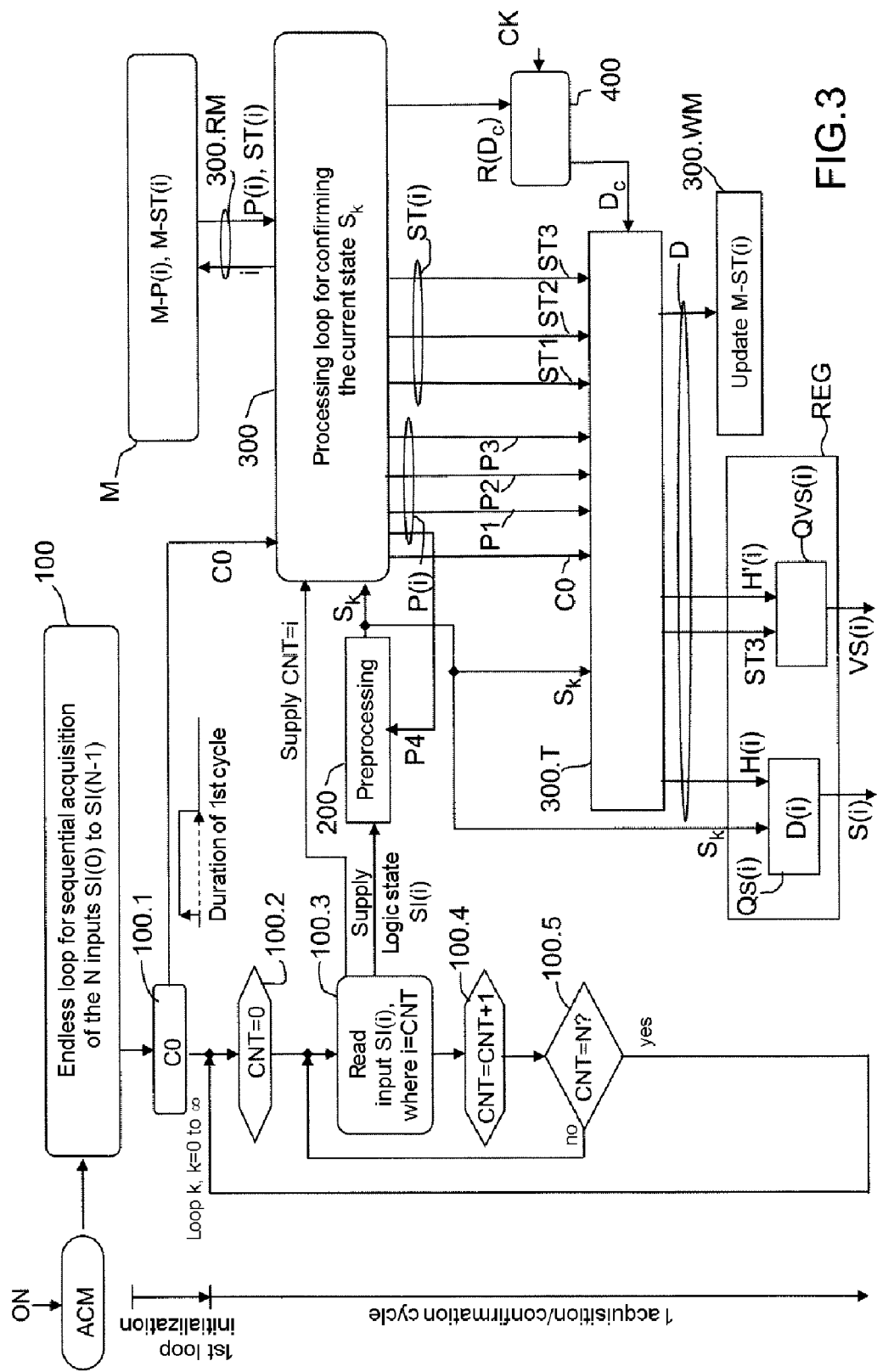
FIG. 3 is a block diagram of the acquisition/confirmation mechanism according to the invention.

A flowchart of an ACM method of acquisition/confirmation of logic signals according to the invention is illustrated in FIG. 3.

This method, or ACM mechanism makes it possible to process a very large number of logic signals SI(i), for example several hundred, with a flexibility of adaptation to the specifics and needs of the application systems, and a minimum of logic resources, in order to supply as an output a confirmed or current (unconfirmed) logic state of each of these signals, depending on the chosen confirmation options, which options can be programmed for each signal. It makes it possible to process signals the logic state of which is coded on m bits, with m being an integer greater than or equal to 1. Irrespective of the number m of bits, the logic state of a signal is processed by the ACM method as a whole, an m-bit magnitude, in order to determine its confirmation status, which is a 1-bit magnitude.

Figure 4:
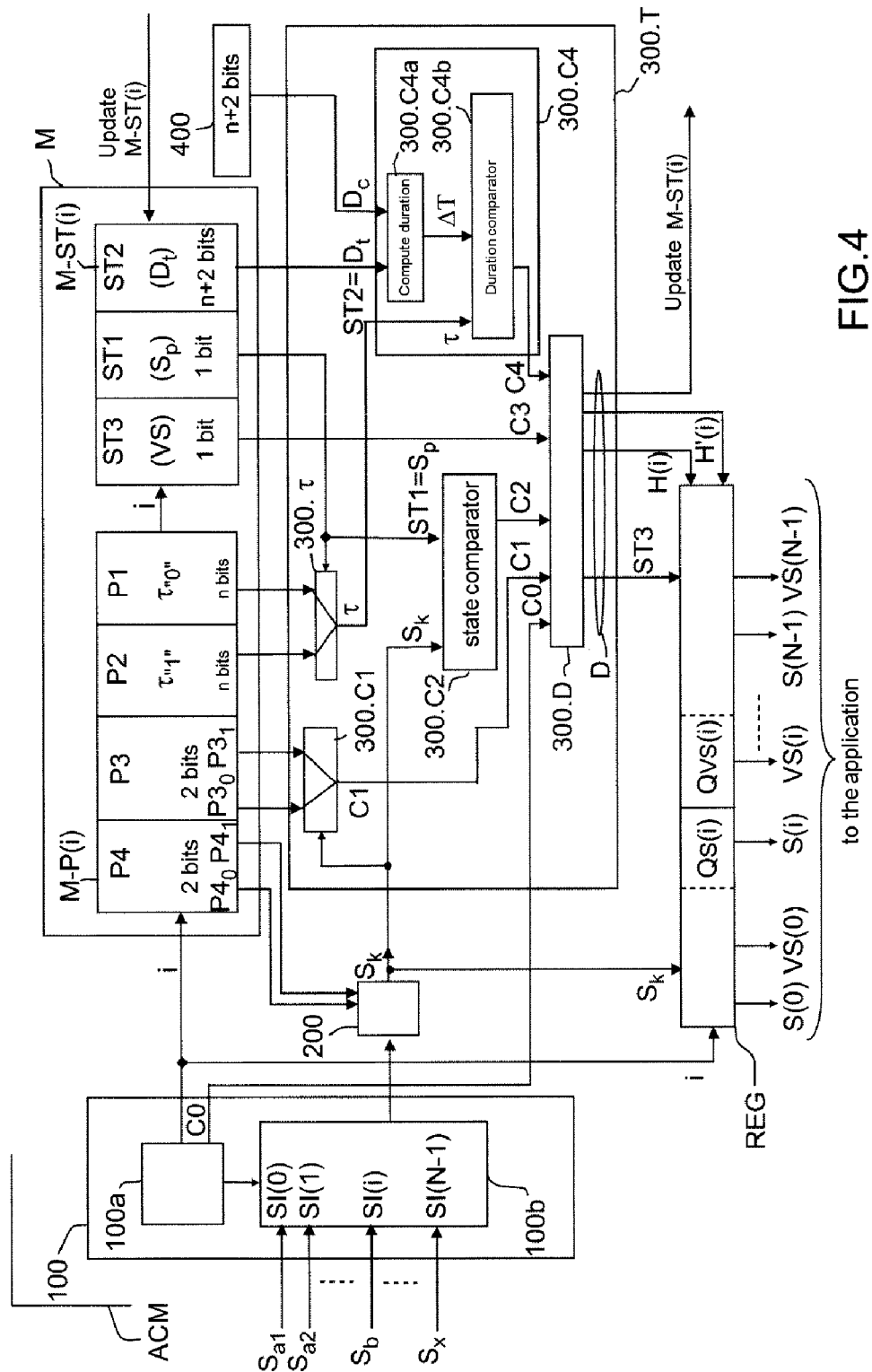
FIG. 4 is a block diagram of an acquisition/confirmation device according to one embodiment of the invention.
Figure 5:
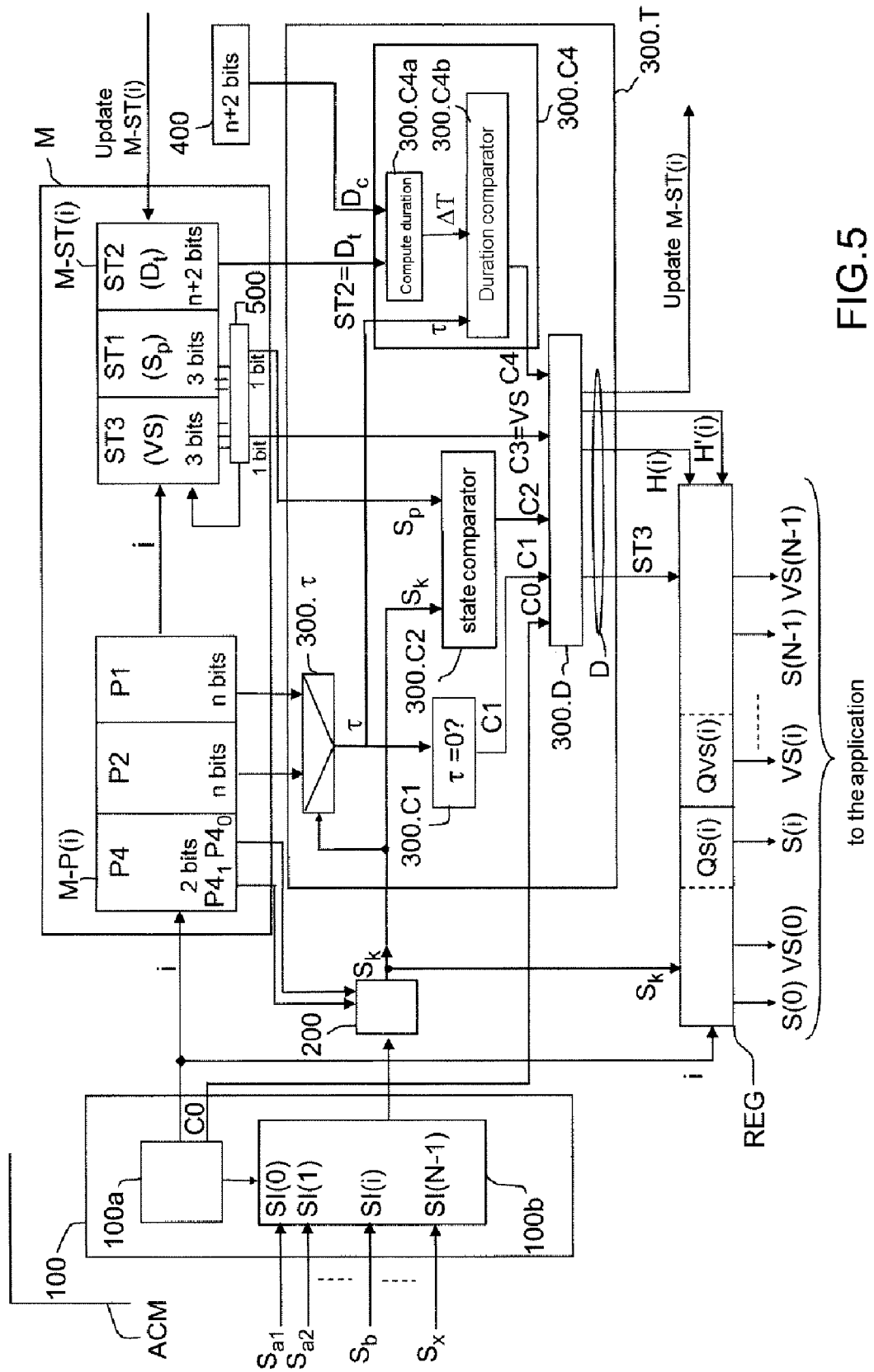
FIG. 5 is a block diagram of an acquisition/confirmation device according to a variant embodiment of the invention.

This method is explained in greater detail below with reference to the flowchart of FIG. 3 and the diagrams of FIGS. 4 and 5 illustrating possible embodiments of this method. For clarity of the description, the same reference numbers are used to indicate a process in the flowchart of FIG. 3 and a corresponding device or program in the diagrams of FIGS. 4 and 5. The term "program" should be understood in the usual manner as a software process used by a microprocessor or a programmable circuit. The term "logic state to be confirmed" should be understood as being to be confirmed with a non-zero confirmation duration.

As illustrated in FIG. 3, the ACM acquisition/confirmation method according to the invention uses mainly an endless loop for sequential sampling 100, a confirmation loop 300, a dating element 400, a status memory M-ST(i) and a parameter memory M-P(i) for each processed signal SI(i). Each iteration of the confirmation loop 300 enables a decision process 300.A which leads to a decision to update or not an output register Qs(i) attributed to the signal SI(i), and/or the associated status memory M-ST(i).

When the acquisition/confirmation method is enabled, typically when the application system is switched on (ON signal in FIG. 3), the endless sampling loop is started, which loop supplies, on each cycle, a current state $S_k$ of the sampled signal SI(i), and the confirmation loop applies the decision process to this current state, in order to update or not update the output register Qs(i). This method stops only on an external command of the application system, typically on switch-off.

An acquisition/confirmation method according to the invention therefore comprises at least the sequential acquisition loop 100, and the confirmation loop 300, and uses a memory block M containing a status memory and a parameter memory for each of the logic signals processed, dating means 400, and a set REG of flip-flops of the output registers Qs(i).

Loop 100 of the Sequential Aquisition of the Logic Signals

The loop 100 for the sequential acquisition of the logic signals is typically enabled by an activation command ON of this system transmitted by the hardware or the application software, typically a command corresponding to the switching on of the application system. It can be stopped by a reverse command, typically by a switching off of the system.

In the example illustrated in FIG. 3, the loop 100 comprises the following steps:

Step 100.1 Enabling of an indicator C0 of first sampling loop. This indicator C0 is advantageously used by the confirmation loop to initialize the status memories, as will be described below. In the example, this enabling consists in generating a width pulse, the duration of a sampling/confirmation cycle: during the first cycle, this indicator is at "1". For all the other cycles (k=1 to infinity), this indicator is at "0". This initialization of the status memory can be managed in another manner, outside the loop 100, for example can be integrated directly into the initialization process of the application system initiated when switched on.

Step 100.2 Initialization of a counter CNT of runs of signals to be sampled. In the example, this counter is set to zero.

Step 100.3 Acquisition of the signal SI(i) pointed by the counter CNT=i, supply of the confirmation loop with the current state $S_k$ of this signal and with the content of the counter CNT, or with an item of equivalent information, identifying the sampled signal SI(i). $S_k$ is an m-bit magnitude, m≧1.

Step 100.4 Incrementing the counter CNT by one unit.

Step 100.5 Test of the counter CNT in order to verify whether the last signal to be sampled SI(N−1) has been reached. If not, return to 100.3 in order to sample the next signal. If so, return to 100.2 to reinitialize the counter, and restart the sampling at the first signal.

In practice, the step 100.5 can be carried out by a counter controlled as a free counter, the maximum counting value of which is N, and which automatically returns to zero when it has reached this maximum value. On each sampling loop, the confirmation loop 300 is enabled in order to determine whether the current state $S_k$ of the sampled signal is a confirmed state or not, and, as a consequence, to update the associated output register and/or the associated status memory before switching to the processing for confirming the next sampled signal. The term "confirmed state" results from the decision process on the current logic state: if it is confirmed, either it is a logic state to be confirmed with a non-zero confirmation duration, and this duration has been reached, or it is not a logic state to be confirmed, which is equivalent to considering that the associated confirmation duration is zero.

The confirmation loop thus receives, on each cycle, the current state $S_k$ of the signal which is sampled SI(i) and a number i identifying this signal, making it possible to address the associated status and parameter memories. In the example, the identifier i originates from the count value of the path counter CNT and varies in the example from 0 to N−1.

In practice, one or more logic-signal acquisition circuits can be used which can be heterogeneous: digital samplers, multiplexers, serial link controller. In the simple example illustrated in FIGS. 4 and 5, the N logic signals S(i) each sampled on one of the N input pins of the sequential sampling loop 100 correspond to signals marked $S_{a1}$, $S_{a2}$, $S_b$, or else $S_x$, which may come from one or more electric interfaces of the application system concerned.

It is possible for certain of the input pins of these circuits to be unused without affecting the method. The sampling loop manager can be programmed to skip these unused pins.

It is also possible to extend the number of logic signals that can be sampled by applying in turn the signals collected by the various circuits: those of a first collection circuit, then those of another, etc. The path loop of the inputs of the acquisition circuit therefore comprises a number of sampling loops which is not necessarily equal to the number of pins of the acquisition circuit, but may be greater. The path counter makes it possible every time to supply an identification of the sampled logic signal, which makes it possible to address the corresponding parameter and status memories and the corresponding output register.

Status Memory M-ST(i)

The status memory M-ST(i) associated with each signal SI(i) processed by the ACM mechanism comprises at least:

a first item of information ST1 indicating the previous logic state of the processed signal SI(i), marked $S_p$, which is in fact the last state seen for this signal, allowing a comparison with a current state $S_k$ of this signal SI(i); ST1 is an m-bit magnitude.

a second item of information ST2, which is the date of transition Dt of the signal SI(i) into the logic state indicated in ST1.

Advantageously, the status memory contains another item of information ST3, typically coded on 1 bit, which gives information on the validity status VS of the current state Sk. For example, by convention, ST3 at "1" indicates that the current state $S_k$ is confirmed. It will be seen that this item of information ST3 makes it possible in certain cases to lighten the decision process since the current logic state (sampled) of the signal SI(i) is unchanged and already confirmed.

As indicated in FIG. 3, this memory ST(i) is addressed by the confirmation loop 300, by means of the indicator identifying the sampled current signal SI(i), i in the example. The confirmation loop 300 addresses this memory in read mode, via a command 300.RM, in order to read the status information ST(i), and in write mode by a command 300.WM, in order to update them, as a function of the processing and decision process 300.T of the confirmation loop 300.

Confirmation Parameter Memory M-P(i)

The parameter memory M-P(i) associated with each signal SI(i) makes it possible to program the confirmation options associated with this signal. As indicated in FIG. 3, this memory M-P(i) is addressed by the confirmation loop 300 by means of the indicator, i in the example, which identifies the sampled current signal SI(i). The confirmation loop 300 addresses this memory M-P(i) in read mode 300.RM, in order to read the configuration parameters P(i) of the processing and decision process 300.T of the confirmation loop 300.

In practice, one or more locations of a live memory block (typically a RAM) are used as a function of the number m of bits of the logic signals and as a function of the number of chosen parameters, and of the number of coding bits of each of these parameters. The set of the parameter memories M P(i) is initialized only once, typically when the application system is switched on. For example, a nonvolatile memory circuit is provided which notably contains the programming data for all the logic signals processed by the ACM device. Or else this initialization is carried out by software, which is more flexible. These data are predefined for the application concerned. In the initialization process, this circuit initializes the set of memories M P(i).

Preferably, the parameter memory M-P(i) associated with each logic signal SI(i) contains at least one non-zero confirmation duration of a logic state to be confirmed.

For the description of the method and of the associated means, in particular of the processes associated with the parameter memory M-P(i), consideration is given initially to the case in which the logic signals are magnitudes m=1 bit. A generalization to the case m bits where m>1 will then be envisioned.

When m=1, each signal SI(i) is a magnitude coded on 1 bit. The items of information $S_k$ and $S_p$ which are the current state and the preceding state seen are therefore also 1 bit. The logic state of the signal SI(i) can therefore take two values: "0" or "1", and it is possible to envision programming the confirmation of each of these values, as illustrated in FIGS. 4 and 5: the memory M-P(i) contains two confirmation-duration parameters P1 and P2 allowing the programming of a confirmation duration for each possible logic state "0" and "1". In these examples, the parameter P1 contains the confirmation duration for the state "0" and the parameter P2 contains the confirmation duration for the state "1". These durations are coded on n bits (n being a non-zero integer).

However, since all the processed logic signals do not have the same characteristics and although it is important to be able to confirm each of the two logic states of certain signals, it is of no value for other signals.

In various embodiments of the invention, it is advantageously possible to configure the parameter memory in order to obtain this flexibility of adaptation to the signals to be processed. The memory thus configured then comprises one or more parameters such that, for each current logic state, it is possible to determine whether it is to be confirmed, that is to say with a non-zero confirmation duration, or not. Two applications of this programming are illustrated in FIGS. 4 and 5 for 1-bit logic signals SI(i).

In the application of FIG. 4, the parameter memory comprises the two confirmation-duration parameters P1 and P2, one for each logic state, and an additional parameter P3, in the example coded on two bits $P3_0$ and $P3_1$, the binary value of which indicates whether the two logic states "0" and "1", or whether only one of the states, and which one, is to be confirmed. The confirmation duration or durations of the states to be confirmed contained in the parameter or parameters P1, P2 are then strictly positive values. The parameter of a state which is not to be confirmed is not used (irrespective of initialization value). The coding of the parameter P3 may for example follow the table below:

| $P3_0$ | $P3_1$ | Logic states to be confirmed |
|---|---|---|
| 0 | 0 | None |
| 0 | 1 | "0" |
| 1 | 0 | "1" |
| 1 | 1 | "0" and "1" |

In the application of FIG. 5, the programming of the confirmation is achieved by the parameters P1 and P2 themselves, which incorporate the indication of the state or states to be confirmed: the confirmation durations of the states "0" and "1" contained in the parameters P1 and P2 are positive or zero binary values: a zero value indicates that the corresponding logic state is not to be confirmed, and a non-zero value indicates that this logic state is to be confirmed, with the confirmation duration, which is non-zero, indicated.

The choice of the various configuration parameters used allows a variety of application variants of the processing and decision process 300.T of the confirmation loop. Two examples thereof will be given below. The choice of these parameters depends notably on the type of application aimed at, and more precisely on the characteristics of the logic signals applied to the ACM device. It also depends on the varying complexity of the desired (programmability) or possible (cost, room) decision logic, and/or on the desired processing speed. The more possible choices there are, by virtue of the configuration options, the more condition tests will have to be run.

In the configuration variants which may be chosen, it is possible to note that there may also be fewer parameters than those indicated in the diagrams of FIGS. 4 and 5.

Specifically, these diagrams are illustrations of variants allowing the configuration of the confirmation of each of the two logic states. In certain applications, it is of no value to provide this possibility. This is notably the case when, irrespective of the logic signal in question, there will still be only one of the two logic states to be confirmed.

In the simplest and least flexible configuration, the parameter memory contains a single parameter, for example P1, containing a confirmation duration, and the processing and decision process is programmed to verify this confirmation duration either for a single logic state, always the same, "1" for example, or for both logic states.

In a variant, it is possible to program the logic state or states to be confirmed with the duration programmed in P1. This can be obtained by using a parameter P3, coded on a single bit, of which the value "0" or "1" would indicate the logic state to be confirmed, according to the following coding table for example:

| P3 | P1 |
|---|---|
| 0 | Confirmation duration for "0" |
| 1 | Confirmation duration for "1" |

By providing two bits for the parameter P3 it is possible to identify, for each possible state "0" and "1" of a 1 bit signal, whether it is to be confirmed with the configuration duration programmed in P1. If m-bit signals are envisioned, the parameter P3 comprises 2m bits, making it possible to determine, for each possible logic state of this signal, whether it is to be confirmed, with the duration indicated in P1 or not. The item of information P3 can then be used in combination with the current state $S_k$ by the processing and decision process 300.T of the confirmation loop 300, either in order to directly update the output register and the status memory if necessary, if the current state $S_k$ is not a state to be confirmed and, otherwise, to enable the confirmation processing with, as the confirmation duration τ, the duration supplied by P1.

In a more general manner, the parameter memory is structured with one or more parameters defined to meet the programming need defined for the application.

Dating Means 400

It is a question of supplying a current date Dc which is used:

to update the item of information ST2 of transition date Dt of the status memory M-ST(i) associated with the sampled current signal SI(i), and;

to allow a measurement of the duration of a logic state since a given transition date Dt relative to the current date.

The current date is therefore arbitrary, since it is used only for the purposes of measuring durations.

It is for example possible to use the date supplied by an internal clock of a computer of an application system for example, by coding it on an appropriate number of bits. It is also possible to provide internal means, for example a free binary counter. In this case, the counter is configured to automatically return to zero when it reaches its maximum value.

The number of bits for coding the date will depend typically on the number of bits for coding the confirmation duration τ. For a confirmation duration coded on n bits, the date will preferably be coded on n+2 bits in order to make the duration computations easier.

Confirmation Loop 300 for the Current State $S_k$

The confirmation loop 300 enables the following processes for each new sample $S_k$:

300.1: Reading of the status memory M-ST(i) and parameter memory M-P(i). These memories are typically addressed by using the information for identifying the sampled current signal SI(i) supplied by the sampling loop. The memory information is read and typically saved in output registers (not illustrated). The memory parameters M-P(i) are notably used to configure the confirmation processing for the current sampled signal SI(i), and in particular, for initializing the confirmation duration τ of the confirmation processing 300.2.

300.2: Processing of confirmation of the current state $S_k$ supplied by the sampling loop. The basic processing uses at least both items of status information ST1 (last state seen Sp) and ST2 (date of transition into this state $S_p$, Dt) supplied by the status memory ST(i), and the configuration parameters P(i), supplying at least one confirmation duration.

The basic confirmation processing 300.2 according to the invention, for a state $S_k$ to be confirmed, is a conditional processing, a function at least of the current state Sk, of the last state seen Sp, and of the date of transition into this state Dt supplied by the items of information ST1 and ST2 of M-ST(i), of the current date Dc supplied by the dating mechanism 400, and of a confirmation duration τ which is initialized with a value supplied by the parameter memory M-P(i).

The various conditions are as follows:

Case a). If this current state $S_k$ to be confirmed corresponds to the previous logic state Sp, and if the confirmation duration τ is reached, then the output register Qs(i) is updated with the value of the current state Sk.

Case b). If this current state $S_k$ is not equal to the previous state $S_p$ (last state seen), it is a detection of transition on the processed logic signal SI(i). The item of information ST1 of the status memory is updated to take the new value given by the sample $S_k$ and the item of information ST2 is updated with the current date Dc supplied by the dating element 400. The state of the output register is unchanged.

The basic confirmation processing 300.2 according to the invention, for a state $S_k$ which is not to be confirmed, which is determined according to the content of the parameters of the memory M-P(i), comprises the updating of the output register Qs(i) with the value of the current state $S_k$. And if this current state $S_k$ is different from the last state seen, the item of information ST1 of the memory M-ST(i) is updated to take the new value given by the sample $S_k$ and the item of information ST2 is updated with the current date Dc supplied by the dating element 400.

Advantageously, when a confirmation status item of information ST3 of the current state is provided in the status memory M-ST(i), this item of information ST3 is updated at the end of the processing of confirmation of the current state Sk, then the confirmation-status flip-flop Qvs(i) is updated. The application therefore has, for each signal SI(i), the last confirmed state S(i), supplied by the output register Qs(i) and, advantageously, the confirmation status VS(i) of the current state of this signal, supplied by the flip-flop Qvs(i).

In a more detailed manner, when the status memory is designed to comprise the items of information ST1, ST2, ST3, the confirmation processing 300.2 also comprises the following steps:

when $S_k$ corresponds to a logic state to be confirmed, which is confirmed according to the case a) above, or when $S_k$ is not a logic state to be confirmed, the item of information ST3 of the status memory M-ST(i) is updated in order to indicate that the confirmation status of the current state $S_k$ is positive (current state confirmed). Typically, this item of information ST3 can be coded on a single bit. By convention, it is possible, for example, to agree that a positive confirmation status is coded with a "1". The confirmation loop 300 then also controls the updating of the confirmation-status flip-flop Qvs(i), with the up-to-date item of information ST3.

when $S_k$ corresponds to a logic state to be confirmed, which is not confirmed according to the case b), the item of information ST3 of the status memory M-ST(i) is updated to indicate a negative confirmation status, in the example coded with a "0". The confirmation loop then also controls the updating of the confirmation-status flip-flop Qvs(i), with the up-to-date item of information ST3.

In this way, the application has, for each signal SI(i), the last confirmed state S(i), supplied by the output register Qs(i) and, advantageously, the current confirmation status VS(i) supplied by the flip-flop Qvs(i). The operating modalities may be varied. As a non-limiting example, the outputs of the registers Qs(i) and flip-flops Qvs(i) may be read periodically, or transition-detection means may be provided to detect a change at the output of the registers Qs(i) and of the flip-flops Qvs(i) in order to enable, for example on an interrupt mode, a corresponding processing. In a variant, it is possible to provide for the application to use as information the current state $S_k$, for example by taking it directly from the interface circuit which supplies the corresponding signal, or by providing an additional output register (not shown), and the validity status VS(i) of this current state.

In an enhancement of the acquisition/confirmation mechanism according to the invention, configurable electric-interface adaptation means 200 are also provided downstream of the sampling loop 100 and upstream of the confirmation loop 300, as illustrated in FIGS. 3 to 5, allowing universal use, independent of the specifics of electric or functional interfaces of an application system. These means comprise at least means for inverting or not inverting the current sample. They are advantageously common to all the signals, the parameter memory comprising corresponding information making it possible to configure, for each signal, the enabling or not enabling of these means, according to the same programming rule for all the signals.

More precisely, when it is a question of providing a programmable adaptation to the specifics of the electric interfaces which supply the signals applied to the acquisition/confirmation device, the adaptation means make it possible to invert the logic state.

As illustrated in FIGS. 3 to 5, these adaptation means 200 are produced in the form of a logic preprocessing of the current sample supplied by the sampling loop in order to deliver the current state $S_k$, at the output, to the confirmation loop 300. This preprocessing 200 is programmed or configured, for each new sampled signal SI(i), by a corresponding parameter P4 of the associated memory M-P(i).

According to one embodiment of the invention, the adaptation means 200 comprise logic gates making it possible to invert or not invert the current sample received, as a function of the parameter P4. This parameter P4 can therefore be coded on a single bit. For example, if P4 is "0", no inversion, if P4 is "1", inversion.

In an enhanced embodiment, the adaptation means 200 allow at least two programmable functions: inversion or forcing to a predetermined logic state. Through this additional programmable forcing function, the means 200 then allow a functional adaptation of an output of a programmable circuit, when the function of this output can vary according to the applications. In one example, programmable circuits such as ASICs make it possible to define a pin as being a logic input or a serial link. When, in a given application, this pin is used as a serial link, making it possible to force to a constant, predetermined value the corresponding current state $S_k$ supplied to the confirmation loop 300 advantageously makes it possible to avoid disrupting this confirmation loop by the unforeseeable changes of state, at the frequency of the serial link, corresponding to the transmitted data.

To allow the programming of at least these two functions, the preprocessing parameter P4 will be coded on at least two bits $P4_0$ and $P4_1$, as illustrated in FIGS. 4 and 5. Various codings can be used in association with the logic of the preprocessing means.

In a coding example, there is one bit per corresponding function, inverting and forcing: a first bit is then used to indicate whether or not it is necessary to invert, and a second bit is used to indicate whether or not it is necessary to force to a predetermined logic state, for example "1", which is the same for all the signals. The logic of the processing means will be produced correspondingly. Advantageously it is possible to provide that the forcing value is programmable. The coding table can then be, for example, the following table TABLE_1:

| Forcing bit $P4_0$ | Inverting bit $P4_1$ | Preprocessing |
|---|---|---|
| 0 | 0 | Forcing to "0" |
| 0 | 1 | Forcing to "1" |
| 1 | 0 | None |
| 1 | 1 | Inversion |

Figure 6:
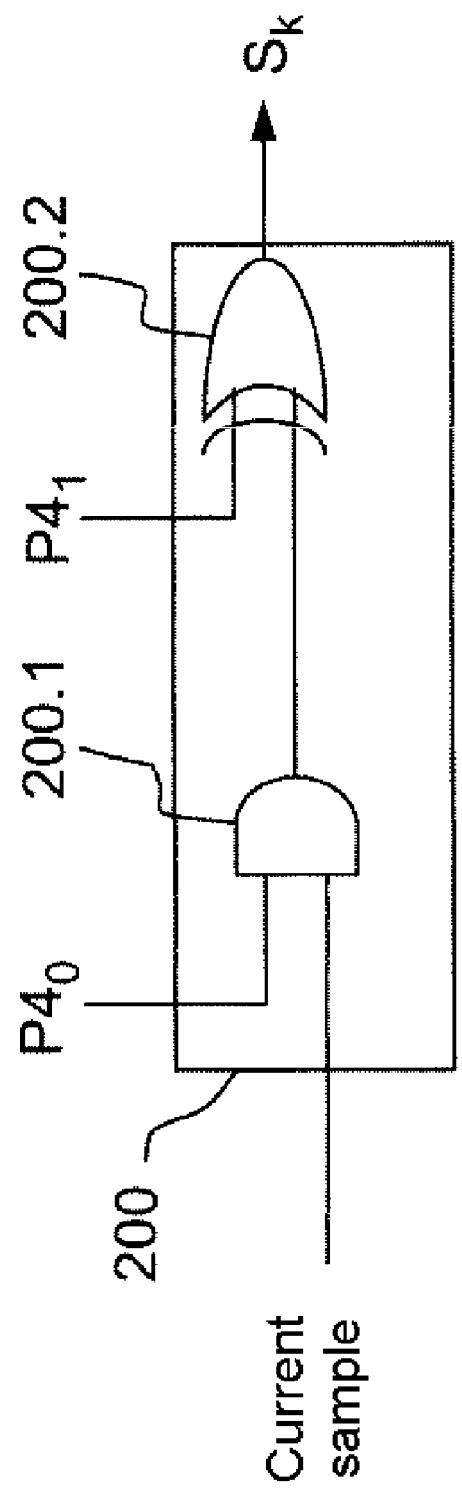
FIG. 6 illustrates a possible embodiment of a preprocessing block of the invention.

The preprocessing 200 itself can be carried out with simple logic gates, as illustrated as an example, for the above coding table, in FIG. 6. In this example, an AND logic gate 200.1, receiving as inputs the forcing bit $P4_0$ and the current sample supplied by the loop 100, followed by a second NOR logic gate 200.2, receiving as inputs the output of the AND gate, and the inverting bit $P4_1$, and supplying as an output the current state $S_k$ presented to the confirmation loop 300.

This programmable preprocessing 200 allows, through simple and not very costly arrangements, an adaptation to the electric interfaces of the application systems. The sampling loop 100 can then sample sequentially and indefinitely each of the signals one after the other, and the confirmation loop can process them without taking account of the electrical specifics (polarity) of the interface or of the interfaces that supply these signals. In particular, the logic of the items of status information and the output data from the output registers Qs(i) and Qvs(i) are independent of the logic of the signals applied by the electric interfaces to the acquisition/confirmation device.

It is possible for the preprocessing 200 that has just been described to not be used. It provides an additional advantage, but is not obligatory for the correct operation of the acquisition/confirmation mechanism of the invention. In all cases, with or without preprocessing 200, it is agreed that the reference $S_k$ always designates in the invention the current state which is presented to the confirmation loop 300.

The ACM acquisition/confirmation mechanism according to the invention, through which the current logic states $S_k$ of the signals are acquired upstream by a sampling loop 100 and examined one after the other at the sampling frequency by a confirmation loop 300, can be used by means of a modest amount of logic and a memory block of reasonable size driven in an appropriate manner in order to carry out the various operations described of reading (memory, counter) and writing (memory, flip-flops). It makes it possible to process a large quantity of logic signals with very great flexibility of configuration. The number of logic signals that can be processed is no longer a function of the amount of logic, and more particularly of a number of counters, but a function of the duration of a complete loop for the acquisition/confirmation of the signals. In other words, it is the sampling frequency and the confirmation durations of the logic signals that determine the number of signals that can be processed. Specifically, the sampling frequency must be chosen so as to miss none of the "true" transitions on the logic signals.

In a realistic digital example, with logic signals the average duration of confirmation of which would be expressed in milliseconds, and with a sampling frequency of 30 MHz, several hundreds of signals can be processed without difficulty. For example, if we take N=300 signals, a complete iteration of an acquisition/confirmation loop of 300 logic signals with this sampling frequency takes t=10 microseconds ($\tau$=n=300/30×106).

With respect to the programming and status data, they can be coded on one or more words of an electrically programmable memory, typically of a live RAM memory block. Notably, a programmable circuit such as an ASIC or an FPGA can offer the necessary memory and register volumes to contain the memories and output registers of all the processed signals (even when the number of logic signals processed is greater than the number of input pins of the acquisition circuit).

Embodiments of the invention makes it possible to apply various decision processes as a function of the status parameters and items of status information, but also as a function of decision logic options.

Two examples of decision processes are more particularly described with reference to FIGS. 4 and 5 to illustrate the invention.

In the application of FIG. 4, the parameter memory and the status memory are configured as follows:

The parameter memory M-P(i) comprises, for each signal Si(i), the following confirmation configuration parameters: P1, coding on n bits the duration $\tau_{"0"}$ of confirmation for the logic state "0"; P2, coding on n bits the duration $\tau_{"1"}$ of confirmation for the logic state "1"; P3, comprising two bits $P3_0$ and $P3_1$, each to indicate whether the associated logic state, respectively "0" and "1", is to be confirmed; and P4, comprising two bits $P4_0$ and $P4_1$ codin preprocessing functions 200 to be carried out according to the coding table TABLE_1 indicated above, namely whether the inverting function is enabled or not, or whether the forcing function is enabled or not, or, if it is, at what forcing value.

The status memory M-ST(i) comprises, for each signal, the items of status information already described; ST1 (last state seen $S_p$), ST2 (date of transition Dt into the logic state stored in ST1) and ST3 (validity status of the current state $S_k$).

In this application, for each logic state to be confirmed, the corresponding duration of confirmation $\tau_{"0"}$ and/or $\tau_{"1"}$ has a strictly positive value. The confirmation loop 300 may comprise the following various processes:

A process $300.\tau$, which makes it possible to initialize the confirmation duration $\tau$ to be used, $\tau_{"0"}$ or $\tau_{"1"}$, in the example, as a function of the value of the last state seen $S_p$ given by ST1. In a variant, this could be as a function of the current state $S_k$. A simple gate of the multiplexer type with two input channels for receiving the two parameters P1 and P2 and one output channel supplying the duration $\tau$ makes it possible to produce this function simply.

A process 300.C1 for determining whether the current state $S_k$ is to be confirmed or not, supplying as an output a condition logic bit C1. A simple gate of the multiplexer type with two input channels for receiving the two bits $P3_0$ and $P3_1$ of the parameter P3, and one output channel supplying the condition bit C1, makes it possible to produce this function simply.

A process 300.C2 for determining whether the current state $S_k$ is or is not identical to the last state seen Sp, produced by a combinatorics logic receiving the two bits as an input and supplying the corresponding condition bit C2 as an output.

A process 300.C3, corresponding to the reading of the validity status ST3 at the beginning of a confirmation loop of the current logic state $S_k$ and which supplies a condition bit C3=ST3.

A process 300.C4, corresponding to the comparison of the duration $\Delta T$ elapsed since the transition date Dt supplied by ST2, with the confirmation duration $\tau$ supplied by the process $300.\tau$. The duration $\Delta T$ is measured by the difference between the current duration Dc, supplied by the counter 400, and the transition date Dt (process 300.C4a). The comparison process 300.C4b supplies the condition bit C4 indicating whether the duration $\Delta T$ is greater than or equal to the confirmation duration.

A decision process 300.D of the confirmation loop. This process may comprise the 4 condition tests of the "if then else" type, associated with the condition bits C1 to C4, which are summarized in the table TAB1 below, with the corresponding consequences on the items of status information ST1, ST2, ST3 of the memory M-ST(i), and the output register Qs(i) associated with the processed signal SI(i):

TAB 1

| | State confirmed S(i) in Qs(i) | ST3 | ST1 | ST2 |
|---|---|---|---|---|
| If the current state does not require confirmation (C1 = 1) | $S_k$ | x | $S_k$ | x |
| ELSE, (C1 = 0) processing of confirmation: | | | | |
| IF $S_k \neq S_p$, detection of transition (C2 = 1) | unchanged | 0 | $S_k$ | $D_c$ |
| ELSE (C2 = 0) : | | | | |
| IF ST3 = 1 (C3 = 1) | unchanged | unchanged | unchanged | unchanged |
| ELSE (C3 = 0): | | | | |
| IF confirmation duration not reached (C4 = 1) | unchanged | unchanged | unchanged | unchanged |
| ELSE (C4 = 0) | $S_k$ | 1 | unchanged | x |

The validity flip-flop of the current state Qvs(i) is updated with ST3 when the conditions C2=1 or C4=0 are realized. The updating of the output register Qs(i) and/or of the flip-flop Qvs(i) with respectively the current state $S_k$ and the bit ST3, after updating of the status memory, is typically obtained by generating in an appropriate manner a corresponding clock pulse H(i), H'(i).

In practice, it is necessary to add a first condition C0, corresponding to the initialization of the status memory, on the first sampling loop, typically when the application system is switched on or reinitialized. This condition C0 is initialized in the initialization step 100.1 of the sampling loop 100, enabled on receipt of an initialization signal ON (FIG. 3). In the example, C0 is forced to "1" for the duration of the first sampling loop (k=0), and remains at 0 for all the k following loops (k=1 to infinity). The condition C0 to be tested can then be written:

IF C0=1, then status memory M-ST(i) initialization, for example set to 0.

Else C0=1.

The loop then moves on to the rest of the confirmation process by running the conditions C1 to C4.

FIG. 5 illustrates a variant application corresponding to different options for confirmation programming with the same decision process 300.D summarized in table TAB1.

In this variant, the memory M-P(i) is structured to contain the parameters P1, P2, which give the confirmation durations $\tau_{"0"}$ and $\tau_{"1"}$ of the two possible logic states, which durations can be initialized with a zero or positive value, the zero value being an indication given to the process meaning that the corresponding logic state is not to be confirmed.

The difference from the previous example lies therefore essentially in that the condition C1 is supplied by the zero or non-zero value of the confirmation duration $\tau$ initialized by the process $300.\tau$, with the content of P1 or P2, as a function of the current state $S_k$ (this could just as well be as a function of the last state seen, $S_p$).

The confirmation loop 300 and the preprocessing mechanism 200 of an ACM acquisition/confirmation device according to the invention may in practice be achieved by means of logic circuits, of the combinatorics type, by means of multiplexer circuits, of logic comparators, and of control circuits for controlling the various logic circuits according to the decision-making mechanism described, in particular reading from and/or writing to the various memories and the current date counter, and driving the various logic gates. These implementations for applying the described operation correspond to routine implementations for those skilled in the art.

Considered hitherto have been logic signals SI(i) the logic state of which is a magnitude coded on a single bit. When m is greater than 1, the current logic state $S_k$ and the item of status information ST 1 are m-bit magnitudes, and the output register Qs(i) will typically include m flip-flops. The items of status information ST2 and ST3 are not impacted. The practical acquisition of the m bits of the signals to be processed can be carried out by serialization: in this case, there will be one input pin per logic signal SI(i) to be processed, and the serialization, that is to say the acquisition of the m bits transmitted in series on the sampled pin, will be processed in steps 100.3 to 100.5 (FIG. 3) of the acquisition loop in an appropriate manner. This acquisition can also be carried out in parallel by assigning m input pins per logic signal to be processed, by adapting the acquisition step 100.3 to m bits. In this case, the acquisition device will include m×N pins.

With respect to the parameters of the memory M-P(i), the parameter P4 associated with the preprocessing process 200 can remain on 2 bits and act collectively on the m bits of SI(i) in order to invert them or force a determined value.

The comparison process 300.C2 is adapted in order to process m bit magnitudes.

The process 300.τ for initializing the confirmation duration will also be impacted if several confirmation durations per signal are envisioned. Where m=1, $S_k$, or $S_p$ could take $2^m=2$ different values, "0" and "1", and it would be possible to envisage $2^m=2$ parameters of confirmation duration, P1, P2, one per possible value. Where m≠1, this application is economical only if the number $2^m$ remains small. For example, if m=2, it is possible to envision $2^m=4$ parameters of confirmation duration. Beyond this, it is possible to combine confirmation durations for several states. For example, it is possible to envision two confirmation-duration parameters P1 and P2, one which applies when the m bit magnitude increases and the other which applies when the m bit magnitude decreases. In this case, it is the sign at the output of the comparator 300.C2 which makes it possible to select the confirmation duration to be applied. If logic signals could be signed magnitudes, an additional parameter can then advantageously be provided in the memory M P(i) and used to control the comparison process 300.C2 in order to indicate whether the processed signal SI(i) is or is not a signed m bit magnitude. Other variants making it possible to match a confirmation duration with various values are possible. For example, it is possible to divide all of the $2^m$ possible values of the signal into k sets, $1<k<2^m$ and provide one parameter per set of possible values. The comparison process 300.C2 is then adapted to identify the set to which the current value $S_k$ (or the last state seen Sp) belongs and send a corresponding selection signal to the process 300.τ to select the corresponding confirmation-duration duration parameter. Depending on the envisioned variants, corresponding adaptations of the processes 300.C2 and/or 300.τ are produced.

With respect to the process 300.C1 making it possible to determine whether a confirmation is necessary, if reference is made to the application illustrated in FIG. 4, in which this process uses a parameter P3, and strictly positive confirmation durations, the latter can be coded on $2^m$ bits or be optimized as a function of the chosen number of duration parameters, and of the processes 300.τ and 300.C2 used. For example, if we take the example of signed m bit magnitudes and of two confirmation-duration parameters, one for the positive magnitudes, one for the negative magnitudes, the parameter P3 can comprise two bits. But it might be possible to prefer the application illustrated in FIG. 5 with no parameter P3, advantageously simpler in this case, which uses zero or positive confirmation durations, and a process 300.C1 which is based on the criterion "τ=0".

Another enhancement of the invention is obtained in the design of the dating means, which makes it possible to extend the accuracy dynamic of the confirmation durations. Specifically, when all the confirmation durations are of the same order of magnitude, that is to say that the average frequency of variation of the signals applied to the acquisition/confirmation device is of the same order of magnitude, a counter of n+2 bits meets the need for measuring and comparing durations.

In certain application systems, it may happen that certain logic states have very short confirmation durations and other logic states may have very long confirmation durations. We then face a problem of coding and accuracy dynamics. In the invention, the proposal is to use a scale factor mechanism to solve this problem. The use of this mechanism requires an L bit counter, where L>n+2 bits, and a scale factor parameter coded on one or more bits, and associated with each of the confirmation durations in the parameter memory M-P(i) in order to indicate the n+2 bits of consecutive weight of the counter 400 to be taken to obtain the current date corresponding to the indicated scale factor.

In a more detailed manner, the L bits of weight L 1 to 0 of the counter are marked $[D_{L-1}, \ldots D_0]$ and the value of the scale factor is marked K. This scale factor is then used to select n+2 bits of the counter from the L bits which are the bits $[D_{K+n+2}, \ldots D_K]$. If the duration of the lowest-order bit of the counter, D0, is called U, then the unit of time of the duration given by the bits $[D_{K+n+2}, \ldots, D_K]$ is $2^K.U$. If K equals 0, the unit of time equals U; if K equals 1, the unit time equals 2.U, if K equals 5, the unit of time equals 32.U. The accuracy obtained is then relative, and equal to $\frac{1}{2^K}$.

Typically, for the short durations to be measured, the lowest-order bits of the counter will be used and, for the long durations, the highest-order bits will be used.

To illustrate this enhancement better, let us take a practical example in which a 19 bit current date counter 400 $[L_{18} \ldots L_0]$, confirmation durations coded on n=7 bits and a scale factor K coded on 4 bits are used. In this example, the maximum value of the scale factor is 10 (19 bits–(n+2)).

Therefore, in the parameter memory, there are, for each confirmation duration, a duration parameter on 7 bits (P1 and/or P2) and an associated scale factor on 4 bits (K1 and/or K2), one factor per duration parameter provided.

In the status memory, the date of last transition Dt (ST2) is coded on 9 bits (n+2).

If the scale factor equals 0, the bits [8:0] of the counter will be used to store the date in the status memory and to calculate the date differences, and the unit of time of the date is U.

If the scale factor equals 1, the bits [9:1] of the counter are used and the unit of time is 2 U.

If the scale factor equals 3, the bits [11:3] of the counter are used and the unit of time is 8 U, . . . etc.

If the scale factor equals 10, the bits [18:10] of the counter, that is to say the 9 highest-order bits, are used and the unit of time is 1024 U.

An ACM acquisition/confirmation device using a scale factor mechanism associated with the date counter 400 therefore makes it possible to have confirmation durations associated with a scale factor equal to 10, which will be 1000 times larger than the confirmation durations associated with a scale factor equal to 1, and with the same relative accuracy equal to $\frac{1}{128}$, that is of the order of 1%. In this embodiment, for each confirmation duration (P1, P2) to be programmed, it is then necessary to count the n bits in order to code the duration, 7 in the example, plus the bits for coding the scale factor, 4 in this example, or 11 bits in all to be provided in the parameter memory for each confirmation duration. And in the status memories, the stored dates (information ST2) are coded on n+2 bits, or 9 bits in the example.

With no scale factor, in order to have the same coding dynamic, 17 bits would be necessary to code each duration in the parameter memory and the dates would have to be coded on 19 bits in the status memory.

The invention is not limited to these two examples of date coding, the ACM device according to the invention being able to support various date codings, with the confirmation mechanism always remaining the same.

In practice, one or more RAM memory blocks are used, one or more addresses of which are reserved for each logic signal, in order to contain all the bits of the associated parameter memory and status memory, and one or more registers for the confirmation-status and confirmed-status flip-flops. The number of addresses to be used depends on the number of payload bits per logic signal and on the width of the memory blocks used (for example 8, 16 or 32 bits).

Another aspect of the invention relates to the protection of the acquisition/confirmation device against corruption of the content of the RAM memories or of the flip-flops due to unforeseen logic events or SEUs ("Single Event Upsets"). Notably, if the application system is used in a radiative environment, which is usually the case, for example, in aviation, these single event upsets can change the state of one or more bits of the memory, or the content of one or more flip-flops.

If this involves a bit of the status memory associated with a logic signal, the effect of such a single event upset will be temporary because the status memory will reestablish itself on the next transition of the logic signal or at the end of the confirmation duration. If the corrupted bit is a bit of the transition date ST2, the visible effect, if the state of the logic signal is not yet confirmed, can be a corruption of the measured confirmation duration $\Delta T$ in the process 400, so that the real confirmation duration will be longer or shorter than the requested confirmation duration. If the corrupted bit is a status information bit ST1, and if the state of the logic signal is not yet confirmed, this will result in a corruption of the confirmation duration $\tau$ applied as an input of the process when the confirmation durations of the logic states 1 and 0 are not the same. If the corrupted bit is the state confirmation bit ST3, the associated output flip-flop will be errored as necessary until the next logic state transition.

In all cases, the status memory will reestablish itself either on the next state transition of the corresponding logic signal or at the end of the applied current confirmation duration $\tau$. Therefore the acquisition/confirmation device has a certain natural robustness against the SEU disruptions of the status memory. Depending on the criticalness of the application system, it is possible to envision or not a device for protecting this status memory.

With regard to the parameter memory, it will be preferable to provide a device for protection against these SEUs because if there is a corruption by an SEU of one or more bits of this memory, this corruption will be permanent until the next initialization of the acquisition/confirmation device.

Logic mechanisms for protecting RAM memories are well known to those skilled in the art and are based on redundancy schemes. They involve a multiplication of the bits to be stored and consequently an increase in the necessary memory size.

With regard to the flip-flops of the acquisition/confirmation device, the confirmation-status flip-flops Qvs (i) are naturally robust since they are rewritten on each new confirmation loop in order to give information on the transitional or non-transitional status of the current state of the signals SI(i).

But the flip-flops of the confirmed-state registers Qs(i) are refreshed only once after each state transition, on expiry of the applied corresponding confirmation duration $\tau$. Also, a corruption due to an SEU can be considered to be temporary for a signal which moves a lot. On the other hand, for a signal that does not move very much, the corruption of the associated output register Qs(i) lasts for a long time and can disrupt the application system. Also, depending on the criticalness of the application system and the characteristics of the logic signals to be confirmed, it may be necessary to provide a protective mechanism. The conventional protective mechanisms, the same as those applied to the memories, can be used. Since these mechanisms are costly in logic, it is possible to protect only the flip-flops of the confirmed-state registers associated with slow signals. For more universal use, it is possible to design devices with only a certain number of confirmed-state registers, protected against the unforeseen logic events, which can be allocated, depending on the application, to signals that change slowly.

In an enhancement, it is possible, to great advantage, to use the acquisition/confirmation device itself to protect the confirmed-state registers by using, in status memories, a code that is resistant to the unforeseen logic events for each of the two items of information of last state seen ST1 and confirmed state ST3. This code is used to refresh the output register Qs(i) of the current processed signal SI(i) by the confirmation loop.

Typically, this code consists in creating a redundancy of each payload bit, allowing the detection and correction of error. At least two redundancy bits per payload bit are required to achieve this. For ST3, there is 1 payload bit. For ST1, there are m payload bits. For each item of information ST1 and ST3, each payload information bit will therefore be written to status memory three times. Therefore, for ST1, 3.m bits are stored, with 3 bits of identical value for each of the m bits of the magnitude ST1. FIG. 5 illustrates the simple case m=1: for each item of information ST1 and ST3, 3 bits are therefore stored which should be identical. On reading of the status memory, a control mechanism 500 compares the 3 bits and decides on the correct value of the processed information bit, typically by majority vote, and transmits this value at the output.

Preferably, the value arising from the majority vote is also used for systematically rewriting the corresponding three bits to status memory. In this manner, errors are prevented from accumulating.

This mechanism of redundancy of the items of information ST1 and ST3 makes it possible to protect the confirmed-state registers. Specifically, the confirmation loop systematically updates the output register Qs(i) of the sampled signal SI(i) with the result of the majority vote taken on the item of information of last state seen. Therefore, if a flip-flop of the output register is corrupted by an unforeseen logic event, this corruption will be temporary and corrected on the next corresponding confirmation loop.

An ACM acquisition/confirmation device according to the invention that has just been described can be easily integrated into a programmable logic circuit such as an ASIC or an FPGA. If such a programmable logic circuit contains a number of fixed, predefined input pins, the device can in reality process a larger number of logic signals. It is the size of the memory integrated into the programmable logic circuit that determines the number of signals that can be processed.

For example, the implementation of an ACM device in an FPGA circuit can be designed to contain the status and parameter memories, and the output flip-flops (confirmed state, confirmation status) of 500 logic signals, with values coded on 1 bit, and to use only two small blocks of RAM (512×32 for the parameter memory and 512×16 for the status memory), a small amount of logic for the functions of the steps 100.X, 200.X, 300.X and 400.X of the method, and two flip-flops (Qs(i) and Qvs(i)) per signal, totaling 1000 flip-flops in the example. With a clock frequency of 33 MHz, it is then capable of processing up to 500 logic signals with a recurrence of 15 microseconds (duration of the endless loop for sampling the 500 signals) and confirmation durations of between 1 millisecond and 1 second in intervals of 1 millisecond. As explained above, the FPGA circuit does not have to have the 500 input pins, but a logic can easily be provided for collecting signals using various mechanisms and capable of applying these signals in an appropriate manner in turn on these pins.

The confirmation/acquisition method of the invention can also be used for other functions, for example filtering or timing functions, or for polarity adaptation functions for signals supplied by external interfaces.

For example, one can usefully use this acquisition/confirmation method when one has to compare a control logic signal Scom on an item of external equipment and a reread signal, when there is a time for establishing the reread signal relative to the activation of the control Scom. This establishment delay can be linked to the use of a power interface for example, or to an item of remote equipment. The acquisition/confirmation method of the invention is then advantageously used not for confirming the state of the control signal Scom, but for filtering the transition phases of the reread signal, corresponding to the establishment time of the reread signal on each transition of the control signal. Such a use is of value when many reread signals have to be controlled with variable establishment times.

This is achieved simply by applying the control signal Scom to an acquisition pin in order to be processed by the sampling loop. A confirmation duration for each state, which corresponds to at least the duration of the transition phase, is made to correspond to the control signal Scom. The confirmation duration can be the same or different for the two states (parameters P1, P2). The output of the confirmation-status flip-flop of this control signal then serves as a signal for validation of the comparison, because, since the confirmation loop reacts to all the state transitions of the control signal, the confirmed-status flip-flop indicates at all times whether the return signal is in a transition or stable phase, and consequently whether the result of the comparison can be used or not.

Figure 7:
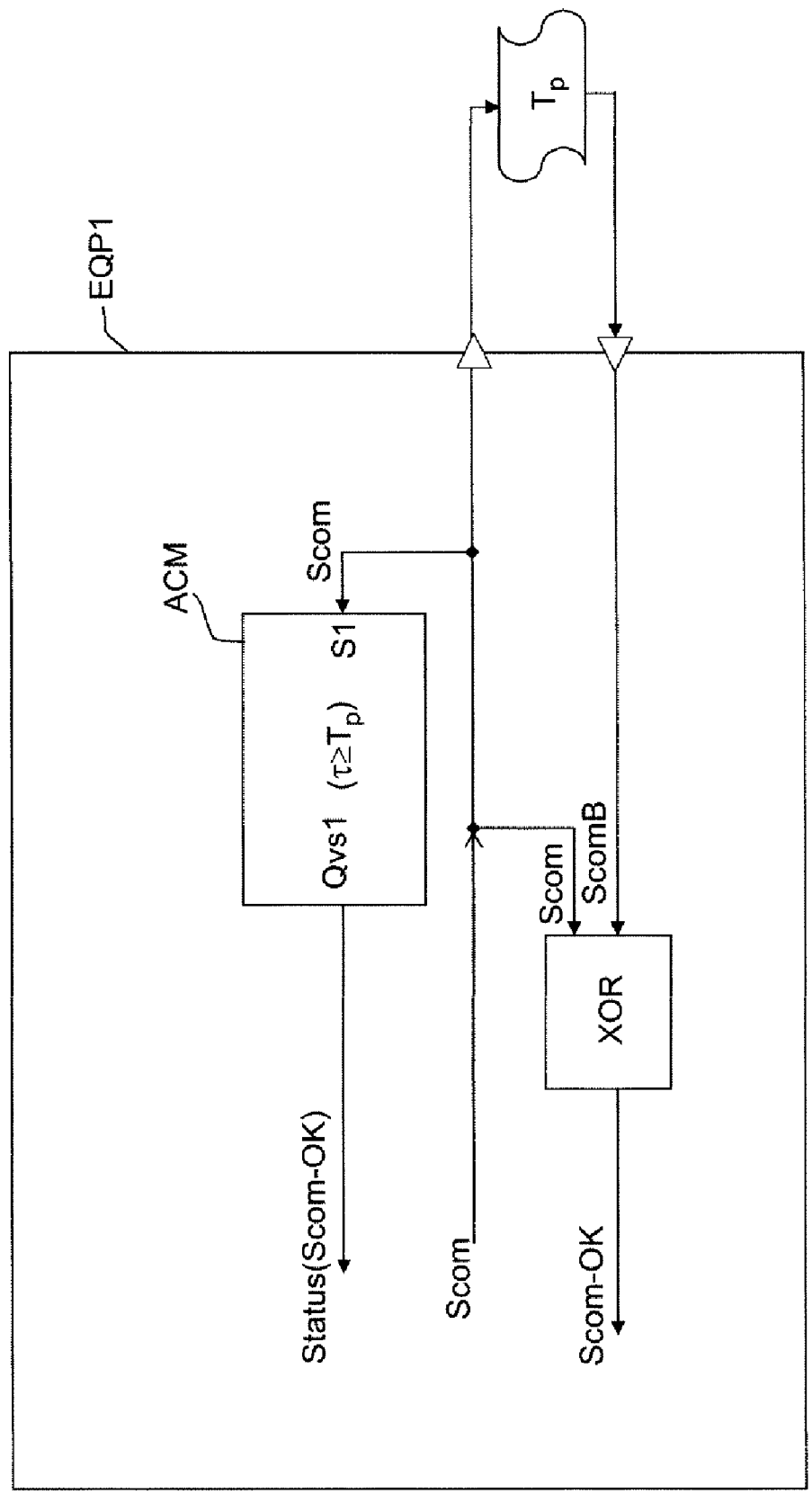
FIG. 7 is a diagram of a use of an acquisition/confirmation method according to the invention, for filtering transition phases of a reread signal of a control logic signal.

Therefore, as illustrated schematically in FIG. 7: a circuit EQP1 incorporates an ACM acquisition/confirmation device using the method of the invention. The circuit EQP1 generates a control logic signal Scom, as an output, to an external device, for example on a power interface. A corresponding reread signal ScomB is applied as an input of the circuit EQP1, for control, by comparison with the initial control signal Scom.

Figure 9:
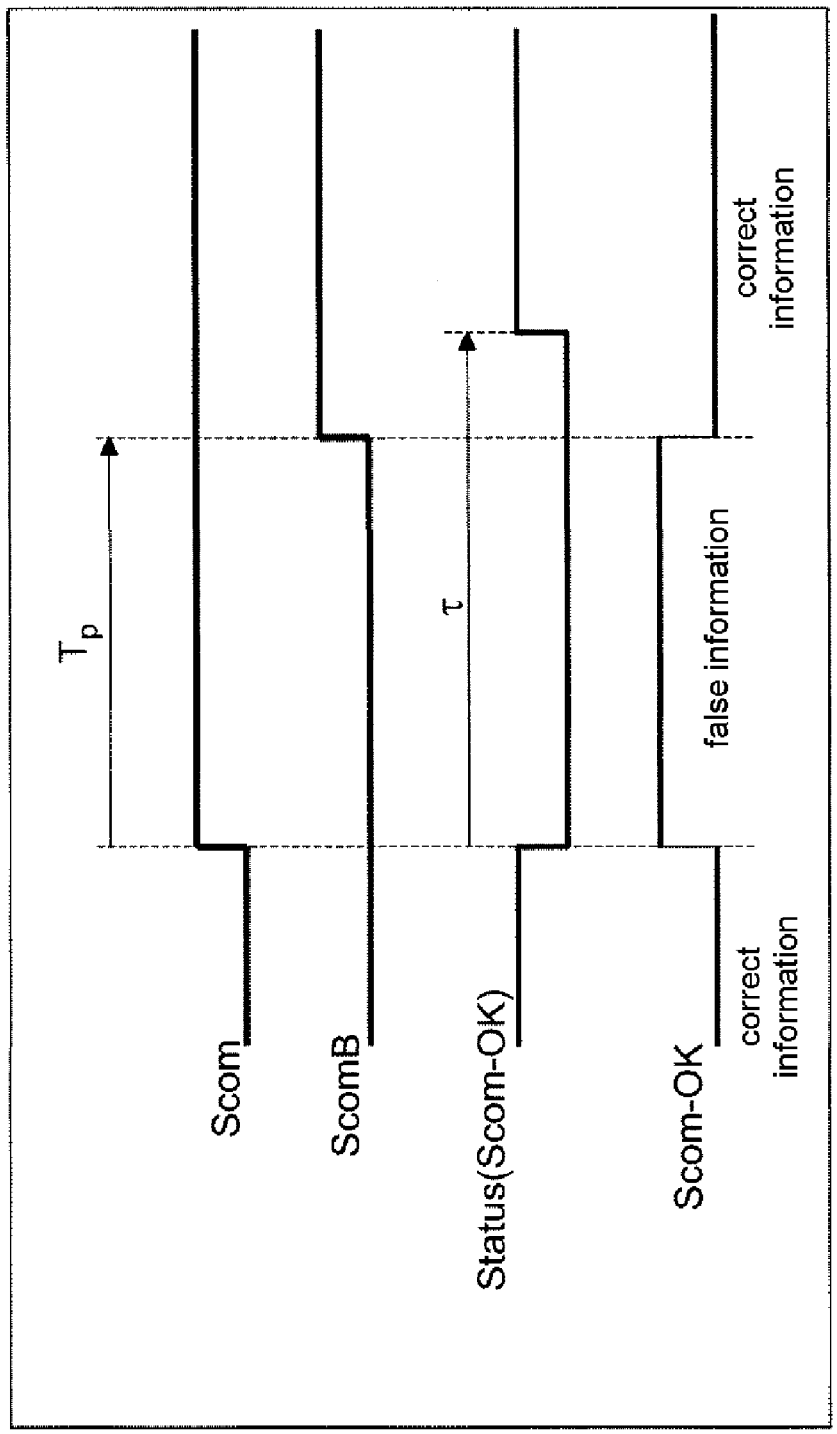
FIG. 9 is a timing chart of the signals of FIGS. 7 and 8.

The signal Scom is applied to an acquisition pin S1 of the sampling loop of the ACM device, and a parameter memory associated with this signal (parameters P1, P2) is programmed with a confirmation duration $\tau$ at least equal to the maximum establishment time $T_p$ of the reread signal. The Status output (ScomB) of the confirmed-state status flip-flop Qvs1 associated with this signal Scom then makes it possible to filter the transition phases of the XOR comparison process between the output control signal Scom and the reread signal ScomB, as illustrated in the timing chart of FIG. 9.

The Status output (ScomB) is therefore like the output of a chronometer, with a start cue, corresponding to a logic state transition of the signal Scom, and a finish cue marked by the expiry of the confirmation duration.

In a variant, it is possible to use the acquisition/confirmation method for simply adjusting in a programmable manner the polarity of a logic signal supplied by an external interface, by using the preprocessing parameter P4. Such a variant can be applied for example to the reread signal ScomB, depending on the characteristics of the interface supplying this signal. It is then the output register that is used, by associating therewith a zero confirmation duration $\tau$. The method of the invention is then used simply to adapt in a programmable manner the polarity of a signal.

Figure 8:
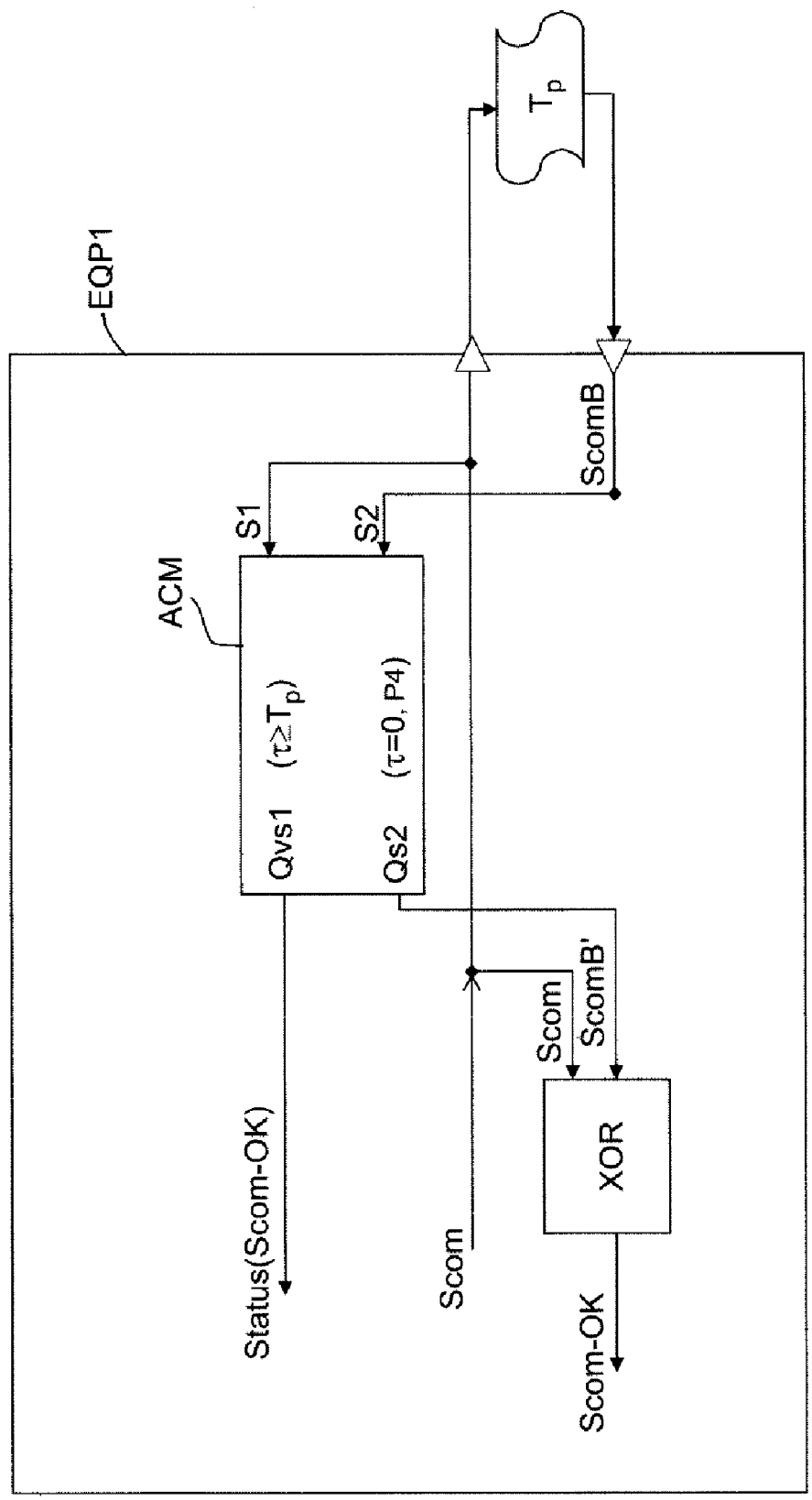
FIG. 8 is a variant of the diagram of FIG. 7 for an advantageous use making it possible to adapt the polarity of the reread signal.

As show in FIG. 8, the signal ScomB is then applied to an acquisition pin S2 in order to be processed by the sampling loop, and the parameter memory associated with this signal ScomB is programmed with a zero confirmation duration and with a preprocessing parameter P4 indicating whether or not the signal has to be inverted. The output of the output register Qs2 associated with this signal ScomB supplies the return signal ScomB' with the desired polarity. In this manner, the problem of adaptation to the electric interfaces is dealt with in a simple manner.

The invention that has just been described proposes an acquisition/confirmation mechanism which makes it possible simply and flexibly to solve the problem of verifying the stability of a logic state of a signal using not very much logic. This mechanism makes it possible to process signals the logic state of which is coded on 1 bit or several bits. It also makes it possible to perform other ancillary functions making it possible to further reduce the logic of the circuit that incorporates this mechanism. It can be applied in all fields where verifications of stability of the logic states of signals are necessary.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A method for the acquisition/confirmation of a plurality of m-bit logic signals, $m \geq 1$, making it possible to verify for each signal that a current logic state of this signal has remained in this state for at least a non-zero determined confirmation duration, before authorizing an update of an output register with said current logic state, wherein said method is programmable, by means of a parameter memory associated with each signal, making it possible to associate a non-zero confirmation duration with one or more logic states to be confirmed of this signal, and to indicate the logic states of this signal which would not have to be confirmed, the method comprising an endless loop for sequential sampling of said signals, the sampling of each signal activating a loop for the confirmation of the current logic state of the sampled signal, in order to update or not update the output register associated with said current logic state, and in which said confirmation loop uses a dating mechanism supplying a current date, and, for each signal to be processed, there is provided an associated parameter memory and a status memory containing at least two items of information, a first item of information indicating the last logic state seen for said signal, and a date of transition into this state.

2. The method as claimed in claim 1, wherein said active confirmation loop, for each current logic state to be confirmed with a non-zero confirmation duration supplied by the associated parameter memory, includes a process of comparing said current logic state with the last logic state seen supplied by the associated status memory, if said current logic state does not correspond to the last state seen, a first process, for updating said first and second items of information of the associated status memory with respectively said current logic state, and the current date supplied by said dating mechanism, is provided, and if said current logic state corresponds to the last state seen, a second process for deciding whether or not to update the output register with said current logic state, said decision being a function of a result of a process of comparing a measurement of the duration elapsed since the transition date supplied by said status memory, up to the current date supplied by the dating mechanism, with a confirmation duration supplied by said parameter memory, is provided.

3. The method as claimed in claim 2, applied to signals of which all the possible logic states are to be confirmed, wherein the decision of said second process depends only on said comparison result, the parameter memory being programmed to supply a non-zero confirmation duration for each possible logic state of the associated signal.

4. The method as claimed in claim 2, applied to signals of which one or more logic states are not to be confirmed, wherein said decision depends on said result, and on an additional item of information, a function of the parameters of said parameter memory, indicating whether said current logic state is to be confirmed.

5. The method as claimed in claim 4, wherein the parameter memory comprises several confirmation-duration parameters, at least two, taking positive or zero values, such that, to each possible logic state of a signal, it causes one of said confirmation-duration parameters to correspond, and a confirmation duration of zero value indicating that the logic state or the logic states of the signal that correspond to it are not states to be confirmed.

6. The method as claimed in claim 4, wherein said parameter memory comprises several confirmation-duration parameters, taking strictly positive values, at least two, such that, to each possible logic state of a signal, it makes one of the confirmation-duration parameters correspond, and an additional parameter making it possible to determine whether the current logic state is a state to be confirmed or a state not to be confirmed.

7. The method as claimed in claim 1, further comprising a process of preprocessing the sample supplied by each sampling loop, said applied preprocessing being a function of a preprocessing parameter P4 provided in the parameter memory, and supplying said current logic state $S_k$ to the confirmation loop.

8. The method as claimed in claim 7, wherein said preprocessing is a negation of the sample or a forcing into a given logic state.

9. The method as claimed in claim 1, wherein said status memory of each signal comprises a third item of confirmed-state validation information, associated with said first item of information of the last logic state seen, of which a high state indicates either that the last state seen is not a state to be confirmed, or, if the last state seen corresponds to a state to be confirmed with a non-zero confirmation duration, that the confirmation duration for the last state seen has been reached, and wherein a validation-status flip-flop is provided for each signal, updated on each confirmation loop of this signal with said third item of information.

10. The method as claimed in claim 9, wherein said second process of the confirmation loop updates the validation status flip-flop with said current logic state, if said third item of validation information is high, and otherwise, decides on the update as a function of said result of the comparison process for comparing the elapsed duration with a confirmation duration.

11. The method as claimed in claim 9, wherein, for each payload bit of each of said first and third items of information, the status memory stores at least three bits, the payload bit and two redundant bits, said method comprising the enabling of a process of detection and correction of an unforeseen logic element on each of said first and third items of information, by majority vote on each reading of said items of information by said confirmation loop.

12. The method as claimed in claim 11, wherein the confirmation loop systematically updates the output register with the result of said majority vote taken on said first item of information ST1.

13. The method as claimed in claim 9, wherein a confirmation status flip-flop is used as a means for filtering transitional phases of a logic signal due to a time for establishing a response associated with a control logic signal, said control logic signal being applied as a logic signal to be sampled by the sampling loop, allowing a corresponding update of an associated confirmation status flip-flop, and the confirmation duration used by the confirmation loop for this signal being programmed to be at least equal to said establishment time.

14. The method as claimed in claim 1, wherein the confirmation durations are coded on n bits, and the dating means supplying a current date comprise a free binary counter supplying n+2 bits.

15. The method as claimed in claim 1, wherein the confirmation durations are coded on n bits, the dating means supplying a current date comprise a free binary counter supplying L bits, where L>n+2, and the parameter memory associated with each signal comprises a scale factor for scaling by confirmation duration contained in said memory, said scale factor determining the n+2 consecutive bits of said counter to be taken as current date.

16. The method as claimed in claim 1, further comprising a process of preprocessing the sample supplied by each sampling loop, said applied preprocessing being a function of a preprocessing parameter P4 provided in the parameter memory, and supplying said current logic state $S_k$ to the conformation loop;

wherein said status memory of each signal comprises a third item of confirmed-stat validation information, associated with said first item of information of the last logic state seen, of which a high state indicates either that the last state seen is not a state to be confirmed, or, if the last state seen corresponds to a state to be confirmed with a non-zero confirmation duration, that the confirmation duration for the last state seen has been reached, and wherein a validation-status flip-flop is provided for each signal, updated on each confirmation loop of this signal with said third item of information;

wherein an output register is used as a programmable means of polarization of a logic signal, as a function of the characteristics of an electric interface supplying said signal, said logic signal being applied as a logic signal to be sampled by the sampling loop, such that said output register is associated with this signal and the confirmation duration used by the confirmation loop of this signal is programmed to be zero.

17. The method as claimed in claim 1, further comprising a process of preprocessing the sample supplied by each sampling loop, said applied preprocessing being a function of a preprocessing parameter P4 provided in the parameter memory, and supplying said current logic state $S_k$ to the conformation loop;

wherein said status memory of each signal comprises a third item of confirmed-stat validation information, associated with said first item of information of the last logic state seen, of which a high state indicates either that the last state seen is not a state to be confirmed, or, if the last state seen corresponds to a state to be confirmed with a non-zero confirmation duration, that the confirmation duration for the last state seen has been reached, and wherein a validation-status flip-flop is provided for each signal, updated on each confirmation loop of this signal with said third item of information;

wherein a confirmation status flip-flop is used as a means for filtering transitional phases of a logic signal due to a time for establishing a response associated with a control logic signal, said control logic signal being applied as a logic signal to be sampled by the sampling loop, allowing a corresponding update of an associated confirmation status flip-flop, and the confirmation duration used by the confirmation loop for this signal being programmed to be at least equal to said establishment time;
wherein an output register is used as a programmable means of polarization of a logic signal, as a function of the characteristics of an electric interface supplying said signal, said logic signal being applied as a logic signal to be sampled by the sampling loop, such that said output register is associated with this signal and the confirmation duration used by the confirmation loop of this signal is programmed to be zero.

* * * * *